United States Patent [19]
Fletcher et al.

[11] Patent Number: 5,233,204
[45] Date of Patent: Aug. 3, 1993

[54] LIGHT-EMITTING DIODE WITH A THICK TRANSPARENT LAYER

[75] Inventors: Robert M. Fletcher, San Jose; Kuo-Hsin Huang, Sunnyvale; Chihping Kuo, Milpitas; Jiann Yu, Palo Alto; Timothy D. Osentowski, San Jose, all of Calif.

[73] Assignee: Hewlett-Packard Company, Palo Alto, Calif.

[21] Appl. No.: 819,542

[22] Filed: Jan. 10, 1992

[51] Int. Cl.$^5$ ............................................. H01L 33/00
[52] U.S. Cl. ........................................ 257/13; 257/94; 257/96; 257/97; 257/103; 372/45; 372/49
[58] Field of Search ................... 357/17, 52, 52 E, 16, 357/55; 372/45, 49; 257/13, 94, 96, 97, 103, 98

[56] References Cited
U.S. PATENT DOCUMENTS

| | | | |
|---|---|---|---|
| 4,833,511 | 5/1989 | Sugimoto | 357/17 X |
| 5,008,718 | 4/1991 | Fletcher et al. | 357/17 |
| 5,048,035 | 9/1991 | Sugawara et al. | 357/17 X |
| 5,153,889 | 10/1992 | Sugawara et al. | 357/17 X |

OTHER PUBLICATIONS

Fletcher et al., "The Growth and Properties of High Performance AlGaInP Emitters Using a Lattice Mismatched GaP Window Layer," *Journal of Electronic Materials*, vol. 20, No. 12, 1991, pp. 1125–1130.

*Primary Examiner*—William Mintel

[57] ABSTRACT

A light emitting diode (LED) including a light generation region situated on a light-absorbing substrate also includes a thick transparent layer which ensures that an increased amount of light is emitted from the sides of the LED and only a minimum amount of light is absorbed by the substrate. The thickness of the transparent layer is determined as a function of its width and the critical angle at which light is internally reflected within the transparent layer. The thick transparent layer is located either above, below or both above and below the light generation region. The thick transparent layer may be made of materials and with fabrication processes different from the light generation region.

18 Claims, 11 Drawing Sheets

LIGHT-EMITTING DIODE WITH A THICK TRANSPARENT LAYER

BACKGROUND OF THE INVENTION

Light emitting diodes (LEDs) having a semiconductor light generation region situated on a light absorbing substrate are widely used as light sources and are beginning to replace incandescent lamps. In order to meet the demands for light output, it is important that the overall light output efficiency of the LEDs be maximized. One improvement made in the prior art, disclosed in U.S. Pat. No. 5,008,718, has been to increase the LED electrical efficiency by including a thin electrically conductive transparent window layer between the light generation region and the top metal contact so that current crowding is minimized. An unfortunate shortcoming of the thin window layer has been that a significant portion of the total light generated by the light generation region is still internally reflected within the window layer and is absorbed by the substrate instead of being emitted out of the LED.

SUMMARY OF THE INVENTION

In accordance with the illustrated preferred embodiments of the present invention, an LED includes a thick transparent layer which ensures that an increased amount of light is emitted from the sides of the LED and light absorbed by the substrate is minimized. The thickness of the transparent layer is determined as a function of the width of the transparent layer and the critical angle at which light is internally reflected within the thick transparent layer.

In an LED constructed in accordance with a first preferred embodiment of the present invention, the thick transparent layer overlays the light generation region which in turn overlays the light absorbing substrate. The inventors have fabricated an LED in accordance with this first embodiment which has a light output efficiency of 40 lumens/amp instead of the approximately 20 lumens/amp which is typical for a prior art LED having a thin electrically conductive transparent window layer. In an LED constructed in accordance with a second preferred embodiment of the present invention, the thick transparent layer is positioned between the light generation region and the light absorbing substrate. In an LED constructed in accordance with a third preferred embodiment of the present invention, a top thick transparent layer is positioned above the light generation region and a bottom thick transparent layer is positioned between the light generation region and the light absorbing substrate.

The thick transparent layer should be made with material with a bandgap bigger than the light generation region so that the transparent layer will not absorb the light generated by the light generation region. The method to fabricate the thick transparent layer may be different from the method used to make the light generation region because certain methods may be more suitable to build thick epitaxial layers.

DETAILED DESCRIPTION OF THE PREFERRED EMBODIMENTS

Figure 1:
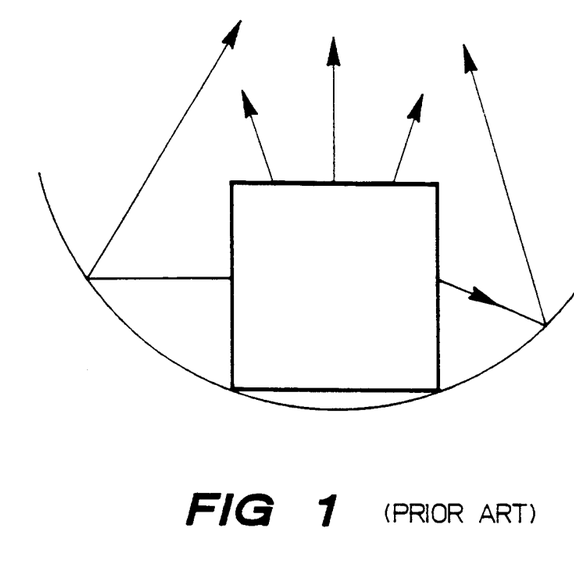
FIG. 1 shows a typical prior art LED in a reflector cup.

FIG. 1 shows a typical prior art LED chip in a reflector cup with light radiating from the top and the sides of the chip. The reflector cup collects light radiating from the sides of the LED chip and directs the light towards a useful direction.

Figure 2:
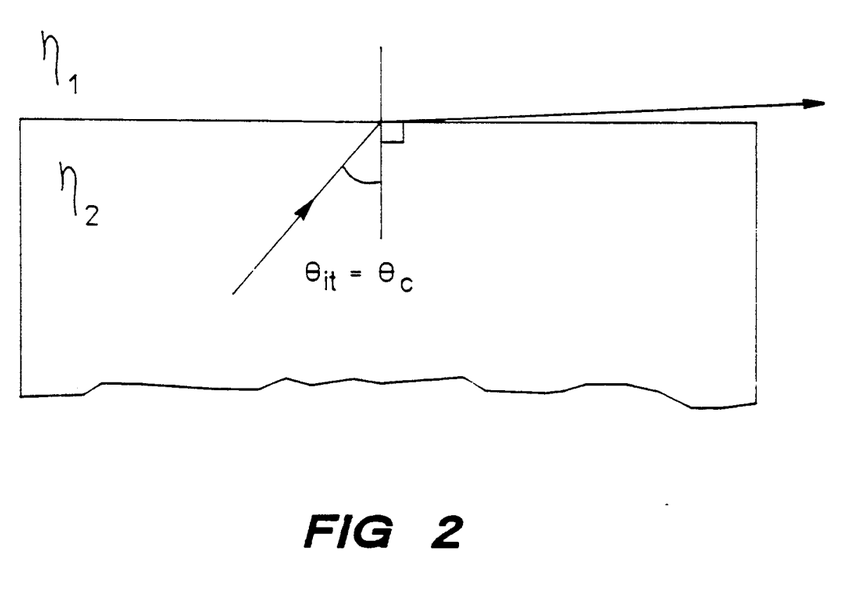
FIG. 2 shows light refraction at the critical angle $\theta_c$.

FIG. 2 shows a light ray incident at a boundary, with an incident angle $\theta_{it}$, between an optically transparent material with refractive index $\eta_2$ and a surrounding medium with refractive index $\eta_1$. At the boundary, there is the critical angle, $\theta_c$, which is defined as $\theta_c = \mathrm{Sin}^{-1}(\eta_1/\eta_2)$. If $\theta_{it} \leq \theta_c$, the ray will be refracted and emitted out of the optically transparent material. With the incident angle $\theta_{it}$ being equal to the critical angle $\theta_c$, the light ray will be emitted at a direction parallel to the surface of the material as shown in FIG. 2. For $\theta_{it} > \theta_c$, the ray of light will be totally internally reflected.

Figure 3A:
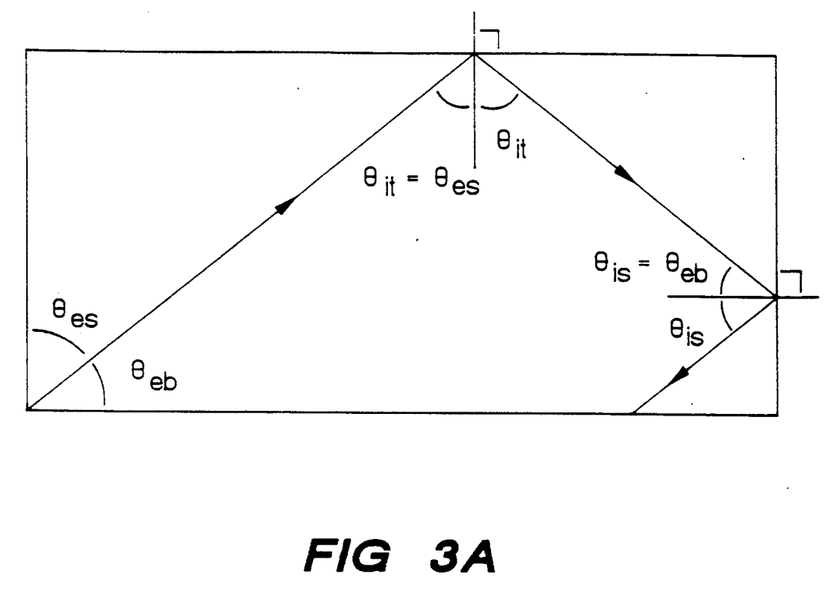
FIGS. 3A-B show total internal reflections of light rays inside a rectangular shaped transparent layer.
Figure 3B:
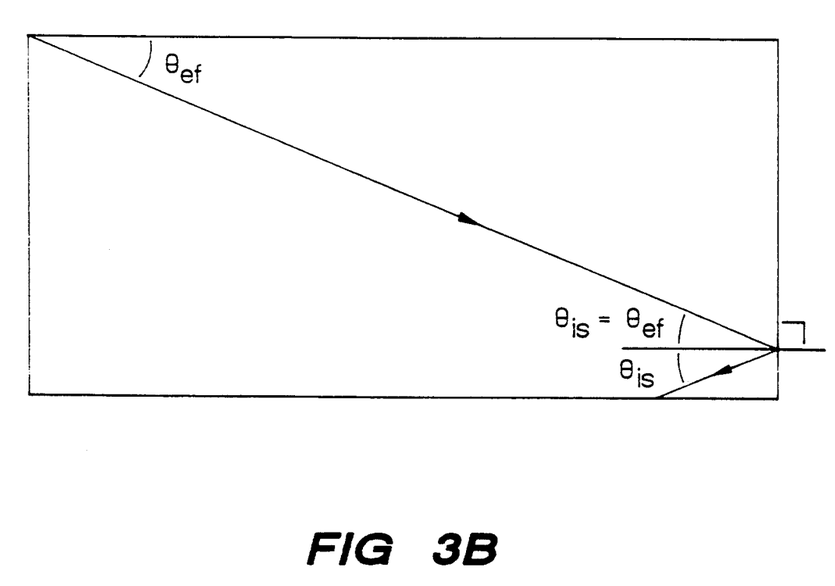

FIGS. 3A-B show total internal reflections of light rays inside a rectangular shaped block of an optically transparent material which has a refractive index bigger than the refractive index of the medium surrounding the block. In FIG. 3A, a ray emits from left hand bottom corner of the block making an angle $\theta_{eb}$ with respect to the bottom surface of the block and an angle $\theta_{es}$ with respect to the side surface of the block. Since the block is rectangular, the ray will hit the top surface of the block with an incident angle $\theta_{it}$ which is equal to $\theta_{es}$. FIG. 3A shows $\theta_{es}$ greater than the critical angle $\theta_c$ so the ray will be totally internally reflected at an angle $\theta_{it}$ and will hit the right hand side surface of the block with an incident angle $\theta_{is}$. Again, since the block is rectangular and the two side surfaces are parallel, $\theta_{is}$ is equal to $\theta_{eb}$. With $\theta_{is} > \theta_c$, the ray incident onto the right hand side surface will be totally internally reflected back onto the bottom surface of the block.

In FIG. 3B, a ray emitted from the left hand top corner of the block makes an angle $\theta_{ef}$ with respect to the top surface of the block and hits the right hand side surface of the block with an incident angle of $\theta_{is}$. Since the block is rectangular, $\theta_{is}$ is equal to $\theta_{ef}$ and if $\theta_{is}$ is greater than the critical angle, the ray will be reflected to the bottom surface of the block.

Figure 4A:
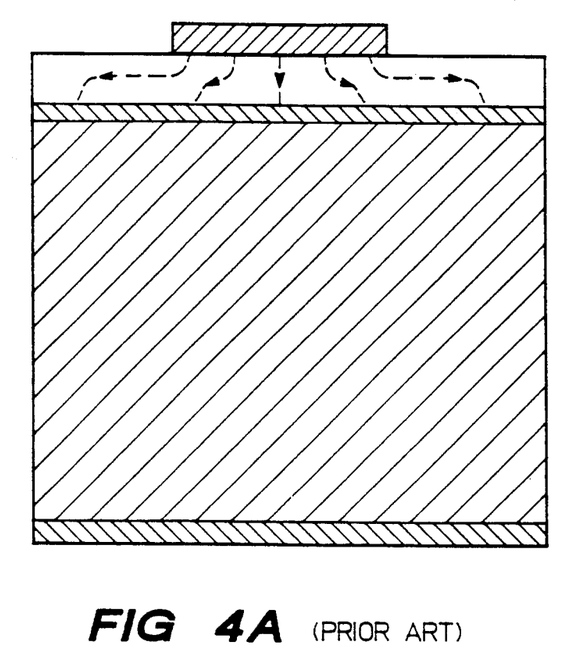
FIGS. 4A-C show a prior art LED including a thin electrically conductive transparent window layer and the intensity of the emitted light as a function of the thickness of the window layer.
Figure 4B:
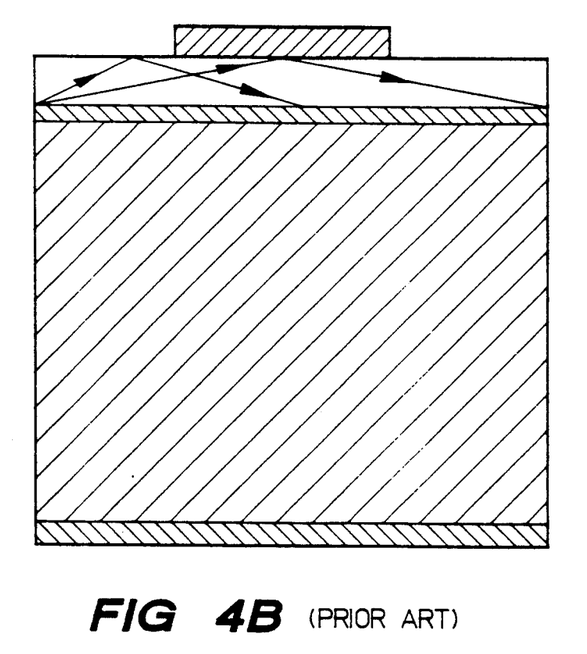
Figure 4C:
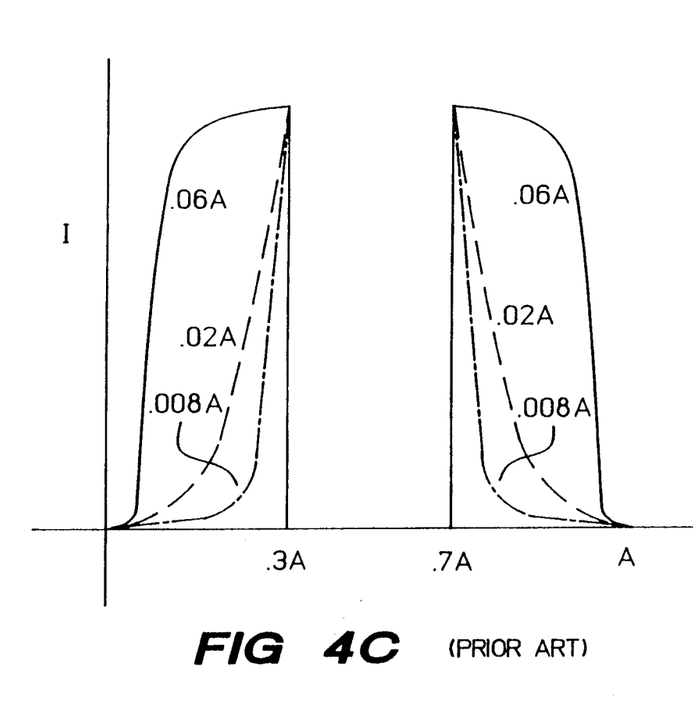

FIG. 4A shows a prior art LED using a thin electrically conductive window layer between the top metal contact and the light generation region to minimize current crowding. This feature is described in U.S. Pat. No. 5,008,718. FIG. 4C shows how the normalized intensity of light emitted from the LED, I, varies as the thickness, D, of the thin window layer varies. Due to the shadowing effect of the top metal contact covering part of the thin window layer, the intensity of light is also not constant across the lateral dimension of the LED. FIG. 4C shows the relationship of the normalized intensity of light output, I, with respect to lateral position as well. This result was reported on page 1128 in the Journal of Electronic Materials, Vol. 20, No. 12, 1991 and was based on the same prior art LED described in U.S. Pat. No. 5,008,718. The prior art LED has a lateral dimension A, of 250 μm, with a 100 μm diameter top metal contact in the middle. Light intensity, I, drops to zero at the two edges, 0 and A, of the LED, and at the area covered by the top metal contact from 0.3 A to 0.7 A or from 75 to 175 μm. Due to the decrease in current crowding effect, as the thickness D goes from 0.008 A to 0.06 A or from 2 to 15 μm, the intensity of light emitting from the LED increases. Further increases in the thickness D will not significantly decrease the current crowding effect so the prior art LED, disclosed in U.S. Pat. No. 5,008,718, has a preferred thickness of 5 to 15 μm. As shown in FIG. 4B, an unfortunate side effect of the prior art use of such a thin window layer is that a significant amount of light is absorbed by the substrate due to total internal reflection within the thin window layer.

Figure 5:
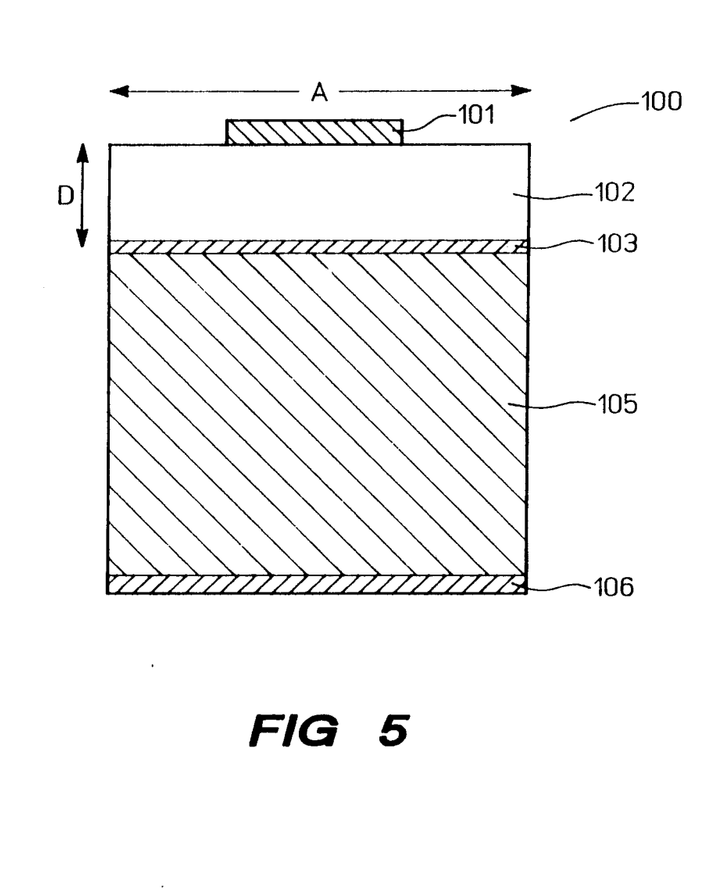
FIG. 5 shows a cross section of an LED constructed in accordance with a first preferred embodiment of the present invention.

FIG. 5 shows a cross-section of an LED 100 which is constructed in accordance with a first preferred embodiment of the present invention. LED 100 has a top metal contact 101, a top thick transparent layer 102, a light generation region 103, a light absorbing substrate 105 and a bottom metal contact 106. The top thick transparent layer 102 has a lateral dimension A and a thickness D. In the following calculation of the thickness, D, the metal contact is removed and the light generation region 103 is assumed to be negligibly thin.

Figure 6A:
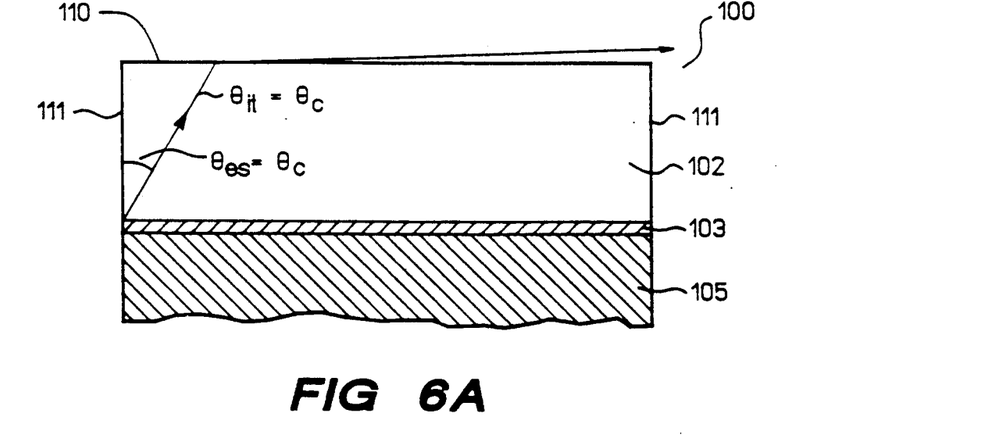
FIGS. 6A-C show internal light paths within the LED shown in FIG. 5 with $\theta_c \leq 45°$
Figure 6B:
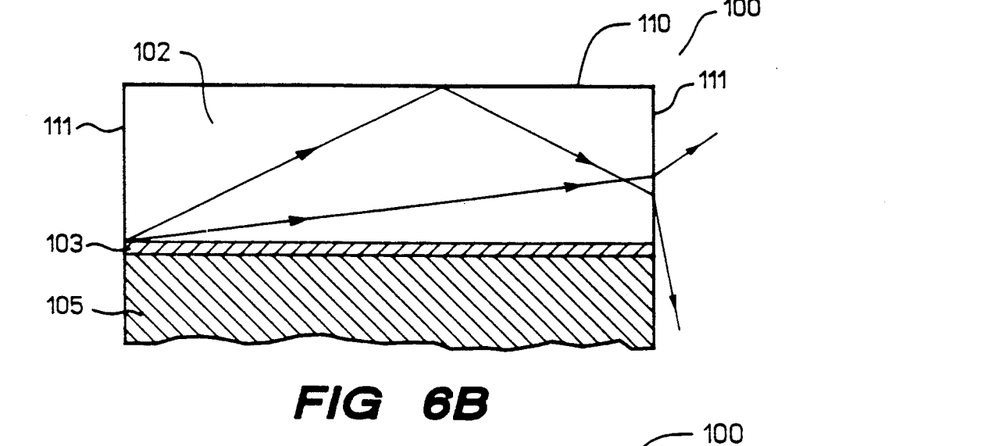
Figure 6C:
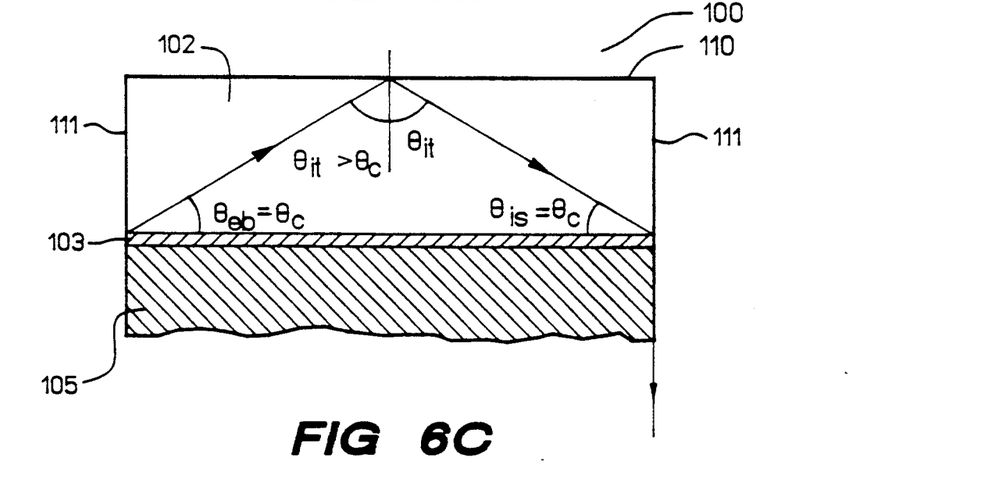

FIGS. 6A-C show the internal light rays of the LED 100 with $\theta_c \leq 45°$. The light rays emitting from the light generation region 103 radiate out of the LED 100 through its top surface 110 or its side surfaces 111. FIG. 6A shows that all the rays from the left corner of the light generation region 103 with $\theta_{es} \leq \theta_c$ radiates out of the top surface 110 of the LED 100 because $\theta_{it} = \theta_{es}$ which is less than or equal to $\theta_c$. FIG. 6B shows the benefit of a thick transparent layer 102 where light rays emit out of the side surface 111 of the transparent layer 102 instead of being absorbed by the substrate 105.

FIG. 6C shows the controlling optical path to decide the aspect ratio, D/A, of the thick transparent layer 102 in order to maximize the amount of light rays radiating from the side surfaces 111 of the LED 100. All the light rays hitting the side surface 111 of the LED 100 with an incident angle, $\theta_{is}$, less than or equal to $\theta_c$ will emit out of the LED 100. Since $\theta_{eb} = \theta_{is}$, this means that all the rays with $\theta_{eb}$ from 0° to $\theta_c$ will radiate out of the LED 100. The controlling ray is the ray with an emission angle $\theta_{eb} = \theta_c$. With $\theta_c \leq 45°$, this controlling ray will hit the top surface 110 of the thick transparent layer 102 with an incident angle $\theta_{it} > \theta_c$ because $\theta_{it} = 90° - \theta_c$. Since the angle of incidence is equal to the angle of reflection, the ray hitting the top surface 110 will be totally internally reflected with an angle $\theta_{it}$. The minimum aspect ratio, D/A, for this ray to emit out of the LED 100 without being absorbed by the substrate 105, is achieved when this ray hits the bottom right hand corner of the thick transparent layer 102. The thick transparent layer 102 is rectangular so the side surfaces 111 are of the same height. With $\theta_{eb} = \theta_{is}$, the point of incidence by the ray hitting the top surface 110 of the thick transparent layer 102 is the middle point of the lateral dimension, A, of the thick transparent layer 102. This means that D is equal to $(A/2) * (\tan \theta_c)$. If D is less than $A * (\tan \theta_c)/2$, some of the light rays that should be able to emit out of the LED will be absorbed by the light absorbing substrate 105. So light output efficiency increases as D increases to $D = A*(\tan \theta_c)/2$ and then remains roughly constant. The thick transparent layer 102 can be very thick such as for mechanical support of the LED, but it takes a lot of time to build very thick layer. Moreover light output may be decreased if D is significantly higher than $D = A*(\tan \theta_c)/2$ because total series electrical resistance and light absorption within the thick transparent layer 102 might significantly increase. Therefore, it might be appropriate to have the thickness, D, of the thick transparent layer 102 not significantly more than 4 times of $(A * (\tan \theta_c)/2)$.

Figure 7A:
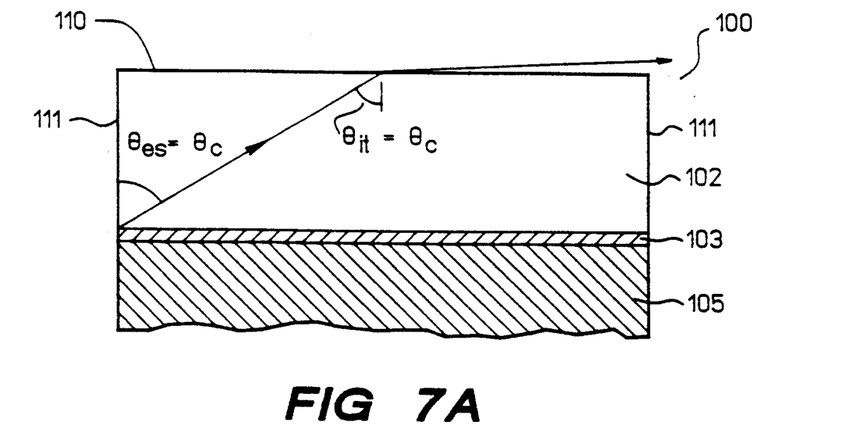
FIGS. 7A-C show internal light paths within the LED shows in FIG. 5 with $\theta_c > 45°$.
Figure 7B:
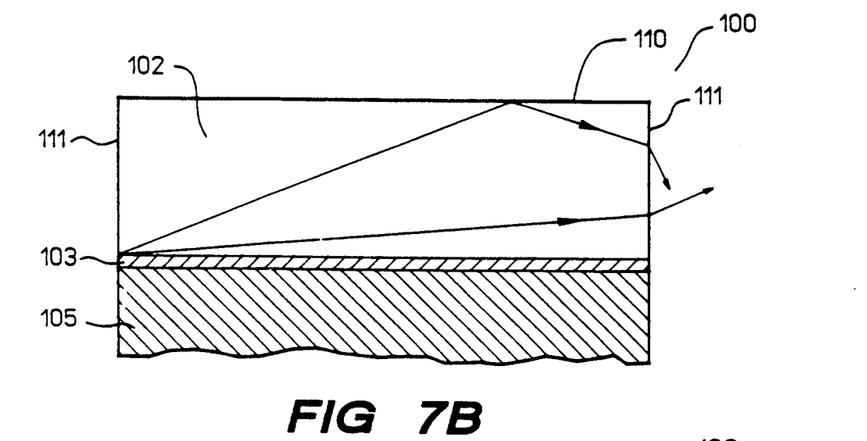
Figure 7C:
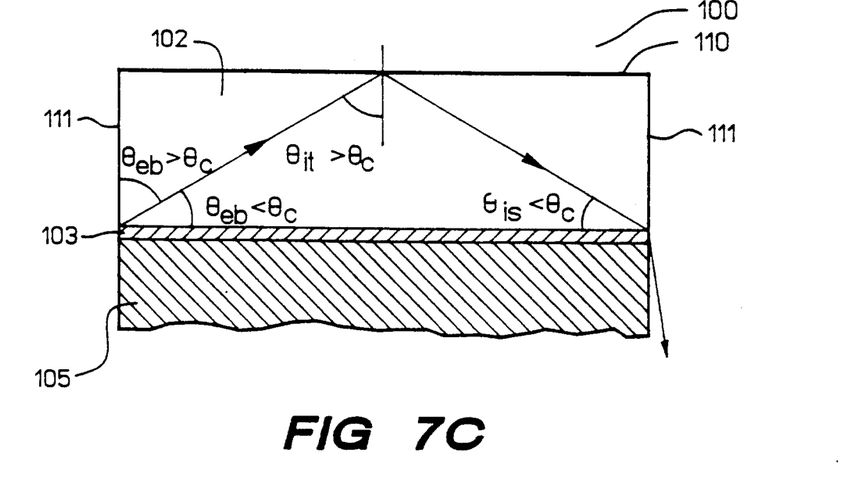

FIGS. 7A-C show the internal light rays of the LED 100 shown in FIG. 5 with $\theta_c > 45°$. FIG. 7A shows that all the rays from the left corner of the light generation region 103 with $\theta_{es} \leq \theta_c$ will radiate out of the top surface 110 of the LED 100 because $\theta_{it} = \theta_{es} \leq \theta_c$. FIG. 7B shows the benefit of a thick transparent layer 102 where light rays emit out of the side surface of the transparent layer 102 instead of being absorbed by the substrate 105.

FIG. 7C shows the controlling optical path to decide the aspect ratio, D/A, of the thick transparent layer 102 in order to maximize the amount of light rays radiating from the side surfaces 111 of the LED 100. With $\theta_{es}$ slightly bigger than $\theta_c$, the emitted ray will be totally internally reflected by the top surface 110 of the thick transparent layer 102 because $\theta_{it} = \theta_{es} > \theta_c$. The minimum aspect ratio, D/A, for this ray to emit out of the LED 100 without being absorbed by the substrate 105, is achieved when this ray hits the bottom right hand corner of the thick transparent layer 102. The thick transparent layer 102 is rectangular so the side surfaces 111 are of the same height. With $\theta_{eb} = \theta_{is}$, the point of incidence by the ray hitting the top surface 110 of the thick transparent layer 102 is the middle point of the lateral dimension, A, of the thick transparent layer 102. This means that D is equal to $(A/2) * (\tan (90° - \theta_c))$. Light output efficiency increases as D increases to $D = A*(\tan (90° - \theta_c))/2$ and then remains roughly constant. The thick transparent layer 102 can be very thick such as for mechanical support of the LED, but it takes a lot of time to build very thick layer. Moreover light output may be decreased if D is significantly higher than $D = A*(\tan (90° - \theta_c))/2$ because total series electrical resistance and light absorption within the thick transparent layer 102 might significantly increase. Therefore, it might be appropriate to have the thickness, D, of the thick transparent layer 102 not significantly more than 4 times of $(A * (\tan (90° - \theta_c))/2)$.

The inventors fabricated an LED 100, as shown in FIGS. 5-7, in which the light absorbing substrate 105 is a GaAs substrate between 150 to 200 μm thick and has a top cross-section that is 250 μm by 250 μm. The light generation region 103, fabricated by a metal-organic chemical vapor deposition (MOCVD) process, is a conventional double heterostructure composed of an n-type bottom confining layer of AlGaInP on top of the substrate 105, an active layer of n-type AlGaInP above the bottom confining layer and a top p-type confining layer of AlGaInP above the active layer. The top and bottom confining layers have a thickness of approximately 800 nanometers and the active layer has a thickness of about 500 nanometers. Zinc, carbon or magnesium are suitable p-type dopants, while tellurium, selenium, sulfur and silicon are suitable n-type dopants. The light generation region 103 could also be fabricated as a homojunction structure instead of a heterojunction LED. Covering the top confining layer is the thick transparent layer 102 of GaP, fabricated by a vapor phase epitaxial process (VPE). The thick transparent layer 102, with a lateral dimension of 250 μm, should be at least 15 μm thick to minimize the effect of current crowding. The GaP thick transparent layer 102 has a resistivity of approximately 0.05 ohm-centimeter and the top confining layer has a resistivity of approximately 0.5 ohm-centimeter. Other materials such as AlGaAs and GaAsP that have bandgaps larger than the bandgap of the light generation region 103 can be used for the thick transparent layer 102. The entire LED 100 is embedded in epoxy which has a refractive index of 1.5. With GaP having a refractive index of 3.3, the critical angle, $\theta_c$, is 27°. With A being 250 μm, the preferred thickness D of the thick transparent layer 102 is calculated to be 64 μm because D is defined as $A*(\tan \theta_c)/2$,. The actual LED 100 constructed by the inventors has a transparent layer 102 with a thickness, D, of 45 μm and the inventors measured light output efficiency to be 40 lumens/amp. The estimated light output efficiency with a 64 μm transparent layer 102 is about 45 lumens/amp.

Figure 8:
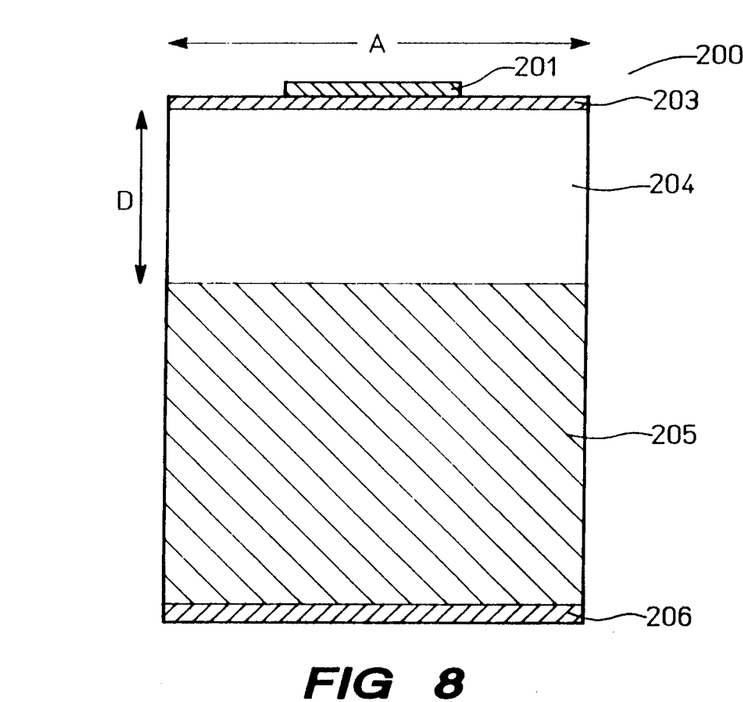
FIG. 8 shows a cross section of an LED constructed in accordance with the second preferred embodiment of the present invention.

FIG. 8 shows a cross-section of an LED 200 constructed in accordance with a second preferred embodiment of the present invention. LED 200 has a top metal contact 201, a light generation region 203, a bottom thick transparent layer 204, a light absorbing substrate 205 and a bottom metal contact 206. LED 200 may be constructed with the same general materials and processes as the LED 100 shown in FIG. 5. The bottom thick transparent layer 204 has a lateral dimension A and a thickness D. In the following calculation of the thickness, D, the light generation region 203 is assumed to be negligibly thin.

Figure 9:
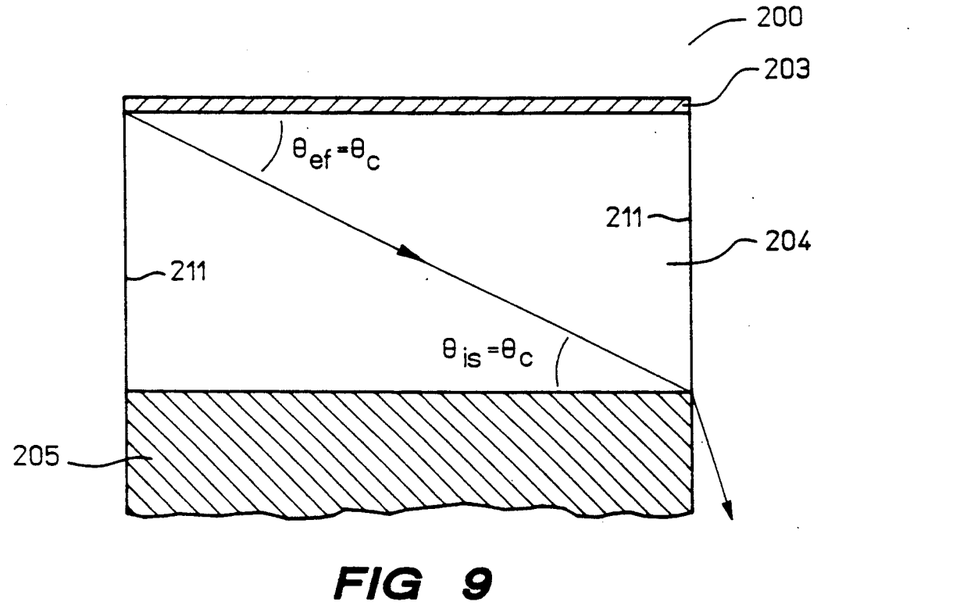
FIG. 9 shows an internal light path within the LED shown in FIG. 8.

FIG. 9 shows the controlling optical path to decide the aspect ratio D/A of the thick transparent layer 204 of LED 200. All the rays hitting the side surface 211 with an incident angle, $\theta_{is}$, less than or equal to $\theta_c$ will radiate out of the LED 200. With $\theta_{is} = \theta_{ef}$, the Optimal aspect ratio, D/A, of the thick transparent layer 204 is tan $\theta_c$. The thick transparent layer 204 can be very thick such as for mechanical support of the LED, but it takes a lot of time to build very thick layer. Moreover light output may be decreased if D is significantly higher than $D = A * \tan \theta_c$ because total series electrical resistance and light absorption within the thick transparent layer 102 might significantly increase. Therefore, it might be appropriate for the thickness, D, of the thick transparent layer 102 not significantly more than 4 times of $(A * \tan \theta_c)$.

Figure 10:
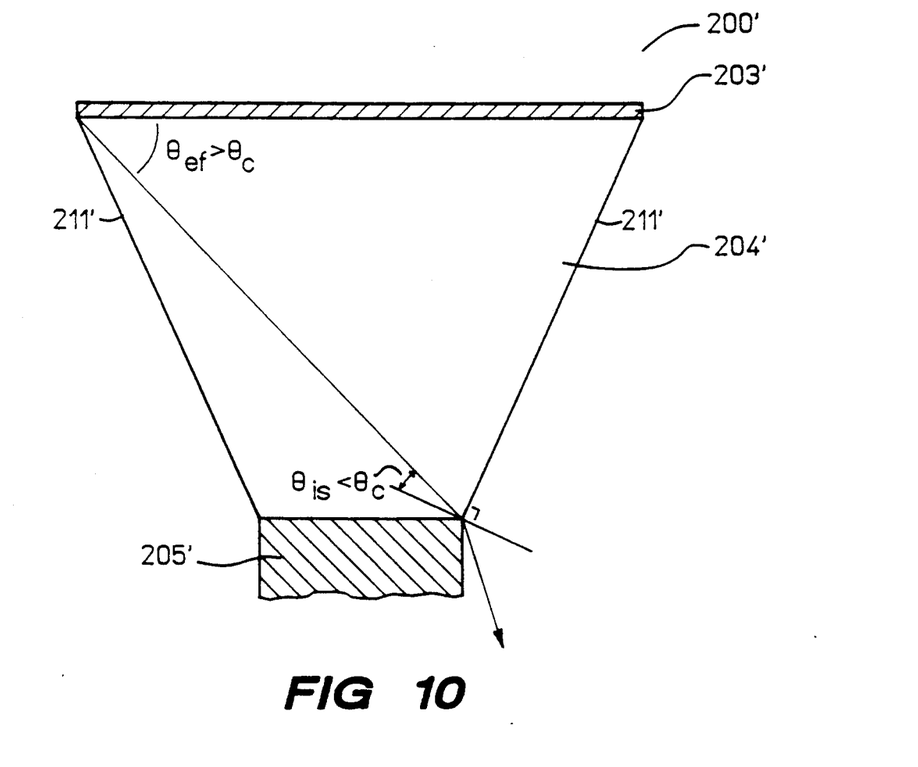
FIG. 10 shows a cross section of part of an LED constructed in accordance with a modified version of the second preferred embodiment of the present invention.

FIG. 10 shows a cross section of part of an LED constructed in accordance with a modified version of LED 200 shown in FIG. 8. The modified version 200' shows an example of a non-parallel funnel-shaped bottom transparent layer 204'. As shown in FIG. 10, even if the emission angle $\theta_{ef} > \theta_c$, the ray still hits the side surface 211' with an incidence angle $\theta_{is} < \theta_c$ and will emit out of the LED 200'. More light can radiate out of the bottom transparent layer 204' if the side surfaces 211' of the thick transparent layer 204' are not parallel to each other since more rays of light will hit the side surfaces 211' with an angle less than the critical angle.

Figure 11:
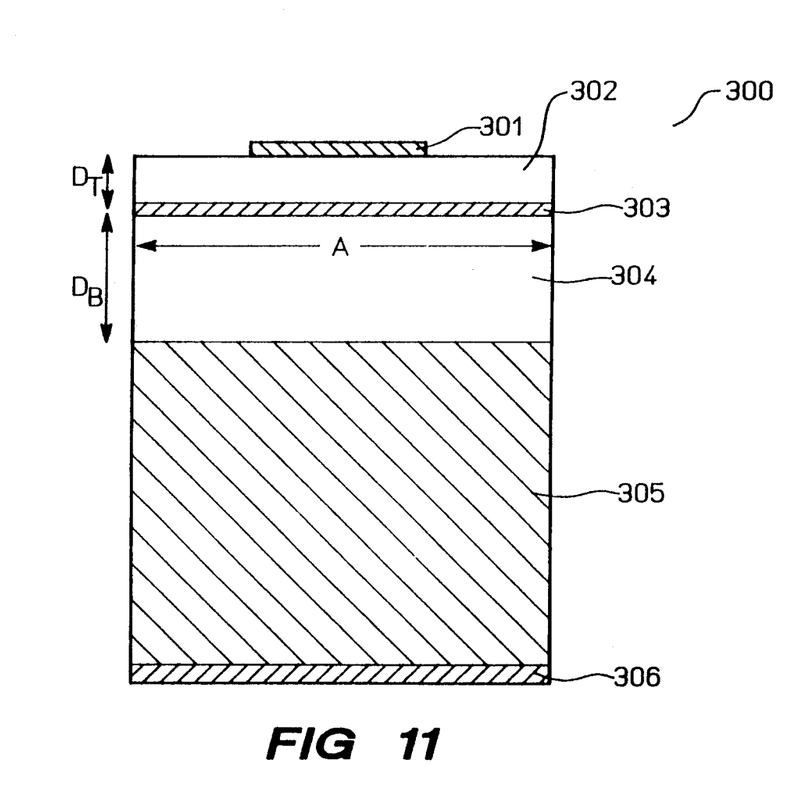
FIG. 11 shows a cross section of an LED constructed in accordance with the third preferred embodiment of the present invention.

FIG. 11 shows a cross-section of an LED 300 constructed in accordance with a third preferred embodiment of the present invention. LED 300 has a top metal contact 301, a top thick transparent layer 302, a light generation region 303, a bottom thick transparent layer 304, a light absorbing substrate 305 and a bottom metal contact 306. LED 300 may be constructed with the same general materials and processes as the LED 100 shown in FIG. 5. In general, the top thick transparent layer 302 does not have to be made of the same material as the bottom thick transparent layer 304 and the aspect ratio $D_T/A$ should be determined as discussed above with reference to FIGS. 5–7. The aspect ratio $D_B/A$ should be determined as discussed above with reference to FIGS. 8–9.

Figure 12:
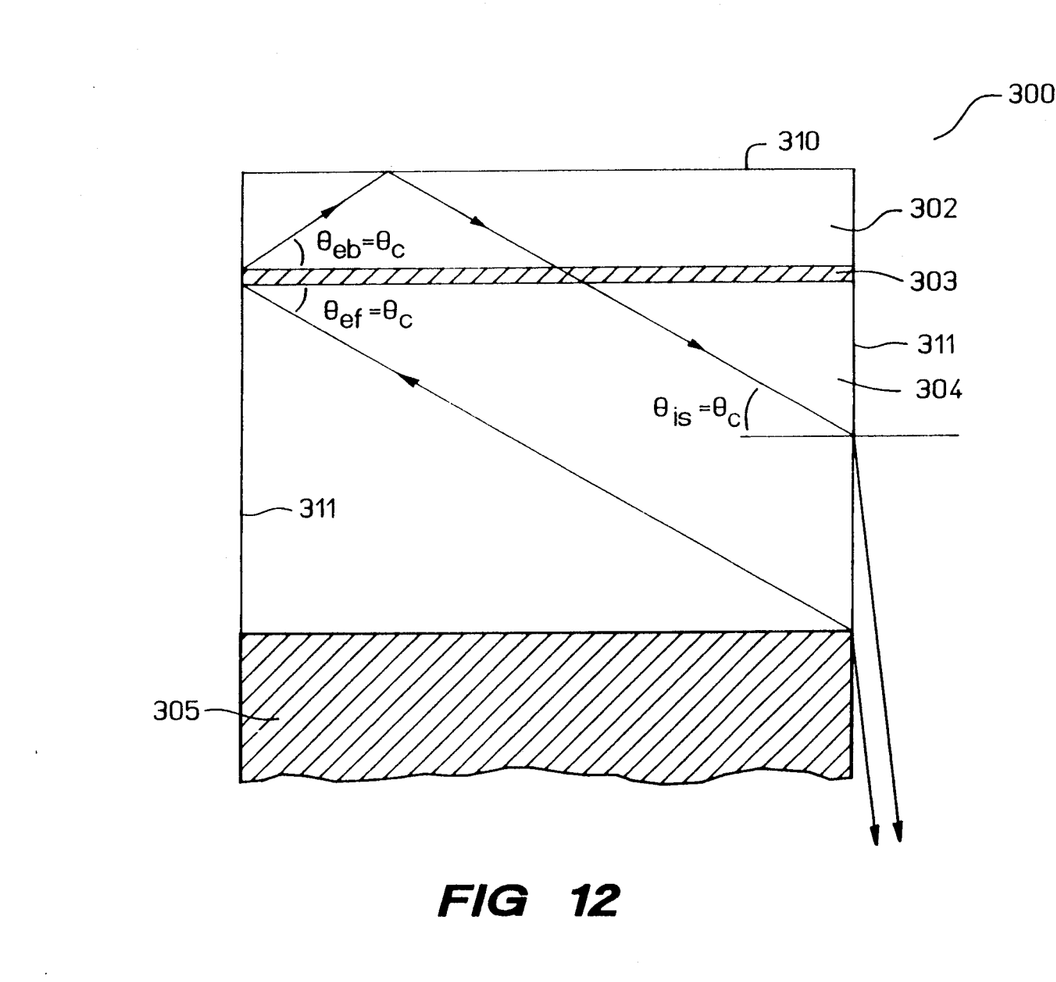
FIG. 12 shows internal light paths within the LED shown in FIG. 11.

However, if the top thick transparent layer 302 is made of the same material as the bottom thick transparent layer 304 or is made of a material with a critical angle less than the critical angle of the bottom thick transparent layer 304, then the aspect ratio $D_T/A$ can be less than those discussed above with reference to FIGS. 5–7. FIG. 12 shows a top thick transparent layer 302 and the bottom thick transparent layer 304 having the same critical angle, $\theta_c$. Since the structure is rectangular, all the light rays with an emission angle $\theta_{eb} \leq \theta_c$ will go out of the LED 300. This is because if the light ray is totally internally reflected by the top surface 310, it will hit the side surface 311 with an incident angle $\theta_{is} = \theta_{eb} \leq \theta_c$ before reaching the light absorbing substrate 305 and will emit out of the LED 300. Thus, the top transparent layer 302 should be thick enough to minimize the effect of current crowding but does not have to be very thick so as to extract light rays from its edges since the light rays can emit out of the side surfaces 311 of the bottom thick transparent layer 304. However, the transparent layers 302 and 304 can be very thick such as for mechanical support of the LED, but it takes a lot of time to build very thick layers. Moreover light output may be decreased if $D_B$ is significantly higher than $D_B = A * \tan \theta_c$ or if $D_T$ is very big because total series electrical resistance and light absorption within the thick transparent layers 302 and 304 might significantly increase. Therefore, it might be appropriate to have the thicknesses, $D_B$ and $D_T$, of both the top 302 and the bottom thick transparent layer 304 not significantly more than 4 times of $A * \tan \theta_c$.

Figures 13A, 13B, 13C, 13D:
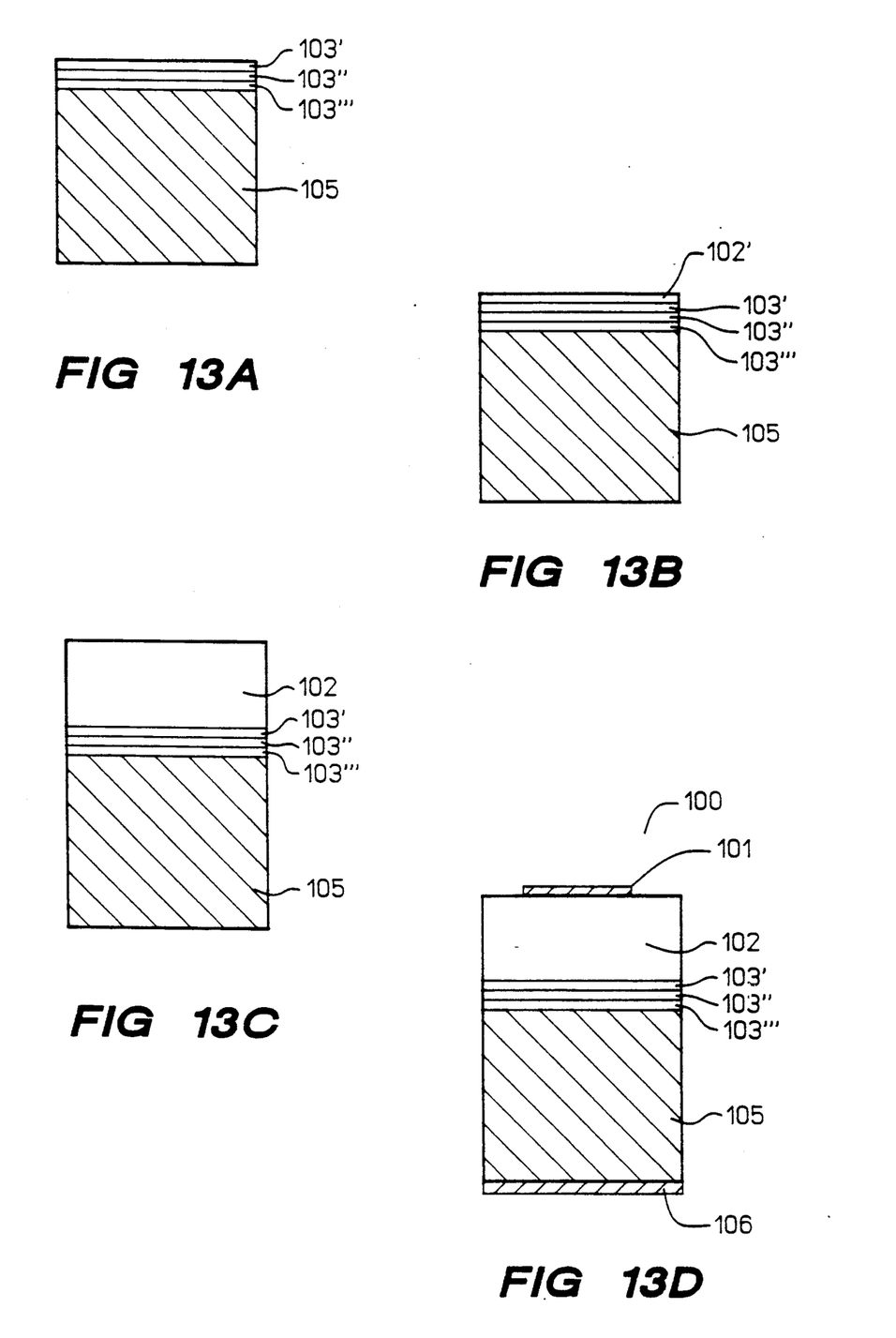
FIGS. 13A-D show the process steps to fabricate the first preferred embodiment of the present invention.

FIGS. 13A–D show a preferred method to fabricate the LED 100 shown in FIGS. 5–7. FIG. 13A shows that using a MOCVD process or a molecular beam epitaxial (MBE) process in a growth chamber, the active layer 103" and the confining layers 103' and 103''' are first epitaxially grown on top of the GaAs substrate 105. Then, as shown in FIG. 13B, without removing the partially fabricated LED 100 from the growth chamber and immediately following the growth of the top confining layer 103', a thin layer 102' is grown on the top confining layer 103'. This thin layer 102' does not have to be of the same material as the final thick transparent layer 102. Serving as a protective and a transition layer, this thin layer 102' is about 2 μm thick. Since the top confining layer 103' has aluminum in it, without the thin layer 102' as a protection, the top confining layer 103' can oxidize, which will detrimentally affect future epitaxial growth. Moreover, the thin layer 102' helps as a transition layer to localize dislocations due to lattice mismatch between the top confining layer 103' and the thick transparent layer 102. The localization enhances future epitaxial growth of the thick transparent layer 102. The thin layer 102' can be GaP or GaAsP or GaAs or AlGaAs.

It is both expensive and difficult to grow thick layers with a MOCVD process or a MBE process. As shown in FIG. 13C, with the thin layer 102' in place, the partially fabricated LED 100 is transported for growing a top thick transparent layer 102 using a different process. Liquid phase epitaxial (LPE) process or vapor phase epitaxial (VPE) process is used to grow the thick transparent layer 102 to a thickness of tens of microns. The top thick transparent layer 102 can be GaP or GaAsP or AlGaAs. If the top thick transparent layer 102 is AlGaAs, the preferred material for the thin layer 102' should be GaAs or AlGaAs.

If the thin layer 102' is made of GaAs or AlGaAs, then the thin layer 102' should be removed before growing the thick transparent layer 102. With LPE to grow the thick transparent layer 102, the thin layer 102' is removed by immersing it into the melt to grow the thick transparent layer 102. The temperature of the melt is first raised a few degrees to dissolve the thin layer 102' back into the melt. Then the temperature of the melt will be lowered to grow the thick transparent layer 102. The method of using and removing a protective layer to grow thick epitaxial layer has been disclosed in a copending U.S. patent application filed on Jan. 12, 1990, under serial number 07/464,275. With VPE, the thin layer 102' can be etched off with a vaporized etchant before growing the thick transparent layer 102. FIG. 13D shows that after growing the thick transparent layer 102, the top metal contact 101 and the bottom metal contact 106 are deposited.

I claim:

1. A light emitting diode, positioned in a medium having a refractive index, $\eta_1$, the light emitting diode having a width, A, and comprising:
   a light absorbing substrate;
   a light generation region overlaying the substrate;
   a top transparent layer overlaying the light generation region, the top transparent layer having sides with a thickness, D, which is greater than a minimum thickness of 0.06 times A and
   wherein the top transparent layer increases the light generation efficiency of the light emitting diode by increasing an amount of light emitted from the sides and reducing an amount of light absorbed by the light absorbing substrate.

2. A light emitting diode as recited in claim 1, wherein:
   the top transparent layer has a refractive index, $\eta_2$;
   $\eta_1$ and $\eta_2$ define a critical angle $\theta_c = \text{Sin}^{-1}(\eta_1/\eta_2)$;
   the critical angle $\theta_c \leq 45°$; and
   the thickness, D, of the top transparent layer is less than 4 times (A * tan $\theta_c$)/2.

3. A light emitting diode as recited in claim 2, wherein the thickness, D, of the top transparent layer is substantially equal to (A * tan $\theta_c$)/2.

4. A light emitting diode as recited in claim 3, wherein the top transparent layer is selected from the group comprising GaP, GaAsP and AlGaAs.

5. A light emitting diode as recited in claim 1, wherein:
   the top transparent layer has a refractive index, $\eta_2$;
   $\eta_1$ and $\theta_2$ define a critical angle $\theta_c = \text{Sin}^{-1}(\eta_1/\eta_2)$;
   the critical angle $\theta_c > 45°$; and
   the thickness, D, of the top transparent layer is less than 4 times (A * tan (90° − $\theta_c$))/2.

6. A light emitting diode as recited in claim 5, wherein the thickness, D, of the top transparent layer is substantially equal to (A * tan (90° − $\theta_c$))/2.

7. A light emitting diode as recited in claim 6, wherein the top transparent layer is selected from the group comprising GaP, GaAsP and AlGaAs.

8. A light emitting diode, positioned in a medium having a refractive index, $\eta_1$, the light emitting diode comprising:
   a light absorbing substrate;
   a bottom transparent layer overlaying the substrate;
   a confirming layer overlaying the bottom transparent layer;
   a light generation region overlaying the confining layer; and
   wherein the transparent layer is thicker than the total thickness of the light generation region and the confining layer.

9. A light emitting diode as recited in claim 8, wherein:
   the light emitting diode has a width, A;
   the bottom transparent layer has a refractive index, $\eta_2$;
   $\eta_a$ and $\eta_2$ define a critical angle $\theta_c = \text{Sin}^{-1}(\eta_1/\eta_2)$;
   the thickness, D, of the bottom transparent layer is less than 4 times A * tan $\theta_c$.

10. A light emitting diode as recited in claim 9, wherein the thickness, D, of the bottom transparent layer is substantially equal to A * tan $\theta_c$.

11. A light emitting diode as recited in claim 10, wherein the bottom transparent layer is selected from the group comprising GaP, GaAsP and AlGaAs.

12. A light emitting diode as recited in claim 1, further comprising a bottom transparent layer between the light generation region and the light absorbing substrate.

13. A light emitting diode as recited in claim 12, wherein:
   the bottom transparent layer has a refractive index, $\eta_2$;
   $\eta_1$ and $\eta_2$ define a critical angle $\theta_c = \text{Sin}^{-1}(\eta_1/\eta_2)$; and
   the thickness, $D_B$, of the bottom transparent layer is less than 4 times A * tan $\theta_c$.

14. A light emitting diode as recited in claim 13, wherein the thickness, $D_B$, of the bottom transparent layer is substantially equal to A * tan $\theta_c$.

15. A light emitting diode as recited in claim 14, wherein:
   the top transparent layer is selected from the group comprising GaP, GaAsP and AlGaAs.

16. A light emitting diode as recited in claim 1, wherein:
   the light generation region is fabricated by a first process; and
   the top transparent layer is fabricated by a second process which is different from the first process.

17. A light emitting diode as recited in claim 8, wherein:
   the light generation region is fabricated by a first process; and
   the bottom transparent layer is fabricated by a second process which is different from the first process.

18. A light emitting diode as recited in claim 12, wherein:
   the light generation region is fabricated by a first process;
   the top transparent layer is fabricated by a second process which is different from the first process; and
   the bottom transparent layer is fabricated by a third process which is different from the first process.

* * * * *